United States Patent
Hong et al.

(10) Patent No.: US 12,471,243 B2
(45) Date of Patent: Nov. 11, 2025

(54) THERMAL DISSIPATION DEVICE AND CONTROL METHOD THEREOF

(71) Applicant: ASUSTEK COMPUTER INC., Taipei (TW)

(72) Inventors: Jyun-Miao Hong, Taipei (TW); Jhih-Wei Rao, Taipei (TW); Zih-Siang Huang, Taipei (TW); Chieh Li, Taipei (TW); Chen-Yu Hsu, Taipei (TW); Chih-Hsien Yang, Taipei (TW); Hung-Chieh Wu, Taipei (TW); Liang-Jen Lin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 413 days.

(21) Appl. No.: 18/157,692

(22) Filed: Jan. 20, 2023

(65) Prior Publication Data
US 2024/0008217 A1    Jan. 4, 2024

(30) Foreign Application Priority Data
Jun. 29, 2022    (TW) ................................ 111124322

(51) Int. Cl.
*H05K 7/20*    (2006.01)

(52) U.S. Cl.
CPC ..... *H05K 7/20209* (2013.01); *H05K 7/20136* (2013.01); *H05K 7/20481* (2013.01)

(58) Field of Classification Search
CPC ........... H05K 7/20209; H05K 7/20136; H05K 7/20481; G06F 1/1632; G06F 1/203
See application file for complete search history.

(56) References Cited

U.S. PATENT DOCUMENTS

| | | | |
|---|---|---|---|
| 2010/0008036 A1* | 1/2010 | Risher-Kelly | G06F 1/1632 62/3.3 |
| 2015/0059358 A1* | 3/2015 | Chang | F25B 21/02 62/3.2 |
| 2020/0341358 A1* | 10/2020 | Hou | H05K 7/20 |
| 2022/0216670 A1* | 7/2022 | Wu | H01S 5/0237 |

FOREIGN PATENT DOCUMENTS

| CN | 113407017 A | 9/2021 |
|---|---|---|
| CN | 111103911 B | 11/2021 |

* cited by examiner

*Primary Examiner* — Zhipeng Wang
(74) *Attorney, Agent, or Firm* — MUNCY, GEISSLER, OLDS & LOWE, P.C.

(57) ABSTRACT

A thermal dissipation device for a handheld electronic device is provided. The thermal dissipation device includes a thermoelectric cooling chip, a temperature sensor, a humidity sensor, and a processing unit. The thermoelectric cooling chip has a cold surface and a hot surface. The cold surface is attached on a heating surface of the handheld electronic device by means of a heat conduction structure, and has a cold surface temperature. The temperature sensor and the humidity sensor are disposed in an area adjacent to the thermoelectric cooling chip for generating an environmental temperature and an environmental humidity respectively. The processing unit is configured to calculate a dew point temperature based on the environmental temperature and the environmental humidity; and determine whether to stop the thermoelectric cooling chip or not based on the cold surface temperature, the dew point temperature, and a heating surface temperature of the handheld electronic device.

14 Claims, 8 Drawing Sheets

THERMAL DISSIPATION DEVICE AND CONTROL METHOD THEREOF

CROSS-REFERENCE TO RELATED APPLICATION

This application claims the priority benefit of Taiwan application serial No. 111124322, filed on Jun. 29, 2022. The entirety of the above-mentioned patent application is hereby incorporated by reference herein and made a part of the specification.

BACKGROUND OF THE INVENTION

Field of the Invention

This disclosure relates to a thermal dissipation device and a control method thereof, and in particular, to a thermal dissipation device for a handheld electronic device and a control method thereof.

Description of the Related Art

As the performance of mobile phones improves, a mobile phone generates more and more heat during operation. The increased heat not only reduces the life of the mobile phone, but also affects the user experience.

To improve the thermal dissipation efficiency, there are many thermal dissipation devices on the market using thermoelectric cooling chips to remove the heat generated by the operation of the mobile phones. However, when the thermoelectric cooling chips are used for thermal dissipation, liquid water is likely to condense in the system, causing instability or even damage to the system.

BRIEF SUMMARY OF THE INVENTION

This disclosure provides a thermal dissipation device for a handheld electronic device, where the handheld electronic device has a heating surface, and the heating surface has a heating surface temperature.

The thermal dissipation device includes a thermoelectric cooling chip, a temperature sensor, a humidity sensor, and a processing unit. The thermoelectric cooling chip has a cold surface and a hot surface, where the cold surface is attached on the heating surface by means of a heat conduction structure, and has a cold surface temperature.

The temperature sensor is disposed in an area adjacent to the thermoelectric cooling chip, and is configured to generate an environmental temperature.

The humidity sensor is disposed in the adjacent area, and is configured to generate an environmental humidity. The processing unit is electrically connected to the thermoelectric cooling chip, the temperature sensor, and the humidity sensor, and is configured to calculate a dew point temperature based on the environmental temperature and the environmental humidity; and determine whether to stop the thermoelectric cooling chip or not based on the cold surface temperature, the dew point temperature, and the heating surface temperature.

This disclosure also provides a control method for a thermal dissipation device. The thermal dissipation device is mounted on a handheld electronic device, and the handheld electronic device has a heating surface and a heating wattage.

The thermal dissipation device includes a thermoelectric cooling chip, a temperature sensor, and a humidity sensor. The thermoelectric cooling chip has a cold surface and a hot surface, where the cold surface is attached on the heating surface by means of a heat conduction structure, and has a cold surface temperature. The temperature sensor is disposed in an area adjacent to the thermoelectric cooling chip, and the humidity sensor is disposed in the adjacent area.

The control method includes: generating, by the temperature sensor, an environmental temperature; generating, by the humidity sensor, an environmental humidity; detecting the cold surface to generate a cold surface temperature; detecting the heating surface to generate a heating surface temperature; calculating a dew point temperature based on the environmental temperature and the environmental humidity; and determining whether to stop the thermoelectric cooling chip or not based on the cold surface temperature, the dew point temperature, and the heating surface temperature.

The thermal dissipation device and the control method thereof according to this disclosure detect the environmental temperature and the environmental humidity inside the thermal dissipation device to calculate the dew point temperature corresponding to the environment inside the thermal dissipation device, and then determine whether to stop the thermoelectric cooling chip or not based on the cold surface temperature of the thermoelectric cooling chip and the heating surface temperature of the heating surface of the handheld electronic device, so as to prevent condensation caused by the continuous operation of the thermoelectric cooling chip, and to achieve a balance between thermal dissipation operation and prevention of condensation.

The specific embodiments of this disclosure are further illustrated by the following embodiments and drawings.

DETAILED DESCRIPTION OF THE EMBODIMENTS

Specific embodiments of this disclosure will be described in more detail below in combination with the accompanying drawings. The advantages and features of this disclosure become clearer based on the following description and the appended claims. It should be noted that the drawings are in a very simplified form and a non-precise scale, and are only intended to explain the objective of embodiments of this disclosure in a convenient and clear way.

Figure 1:
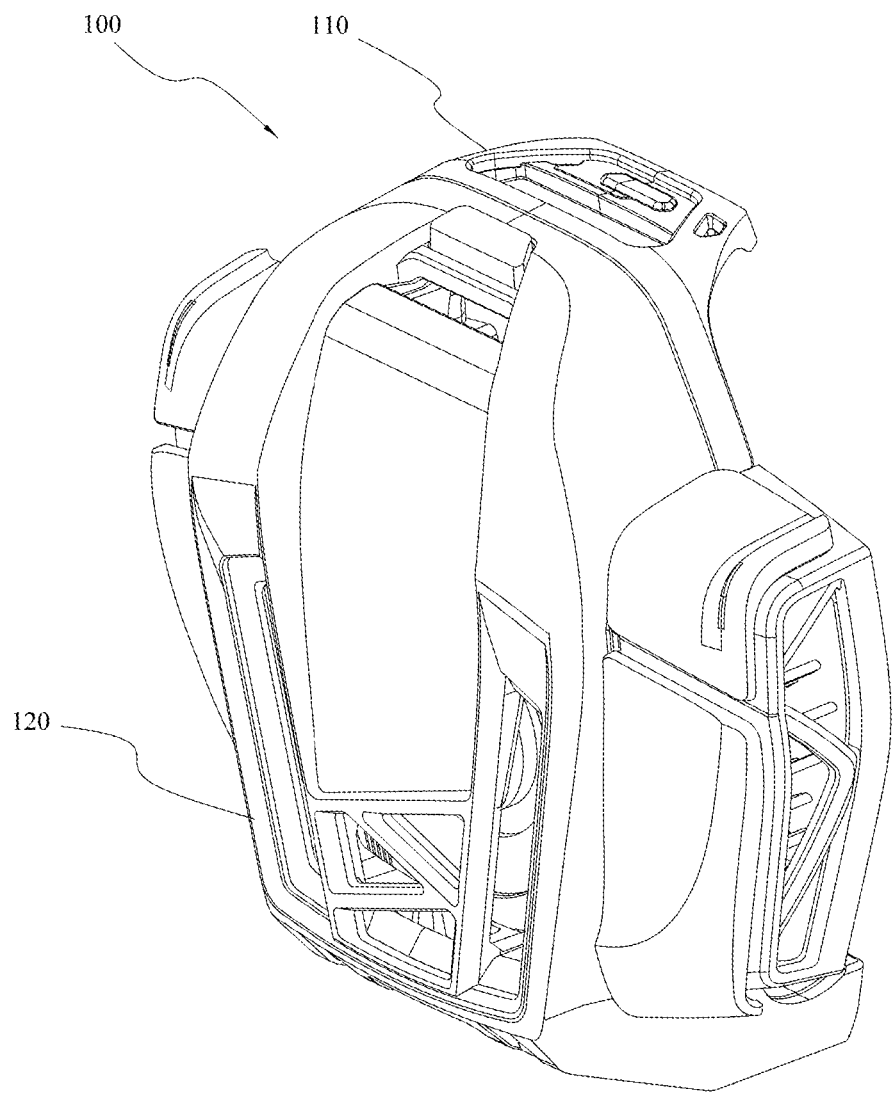
FIG. 1 is a schematic three-dimensional front view of a thermal dissipation device according to an embodiment of this disclosure.
Figure 2:
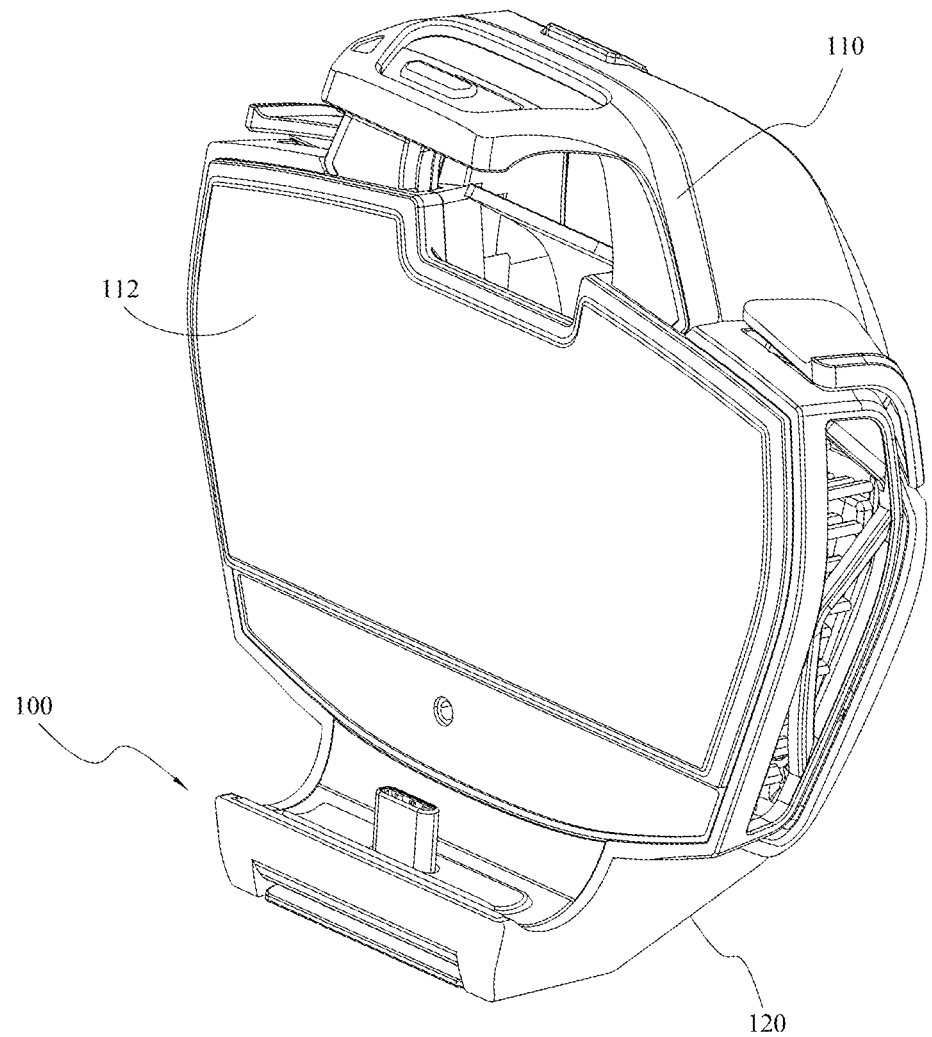
FIG. 2 is a schematic three-dimensional rear view of the thermal dissipation device in FIG. 1.
Figure 3A:
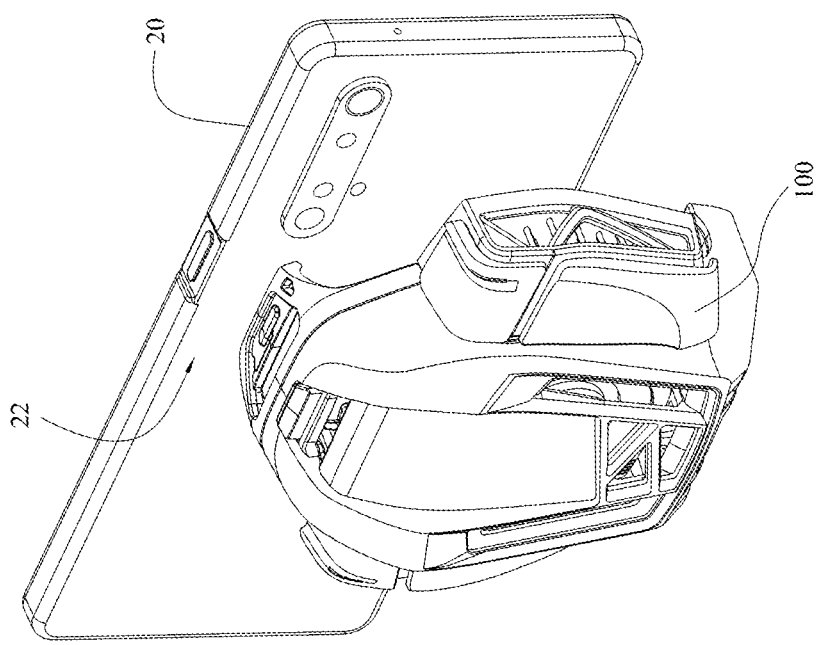
FIG. 3A and FIG. 3B are schematic diagrams of the thermal dissipation device in FIG. 1 mounted on a handheld electronic device.
Figure 3B:
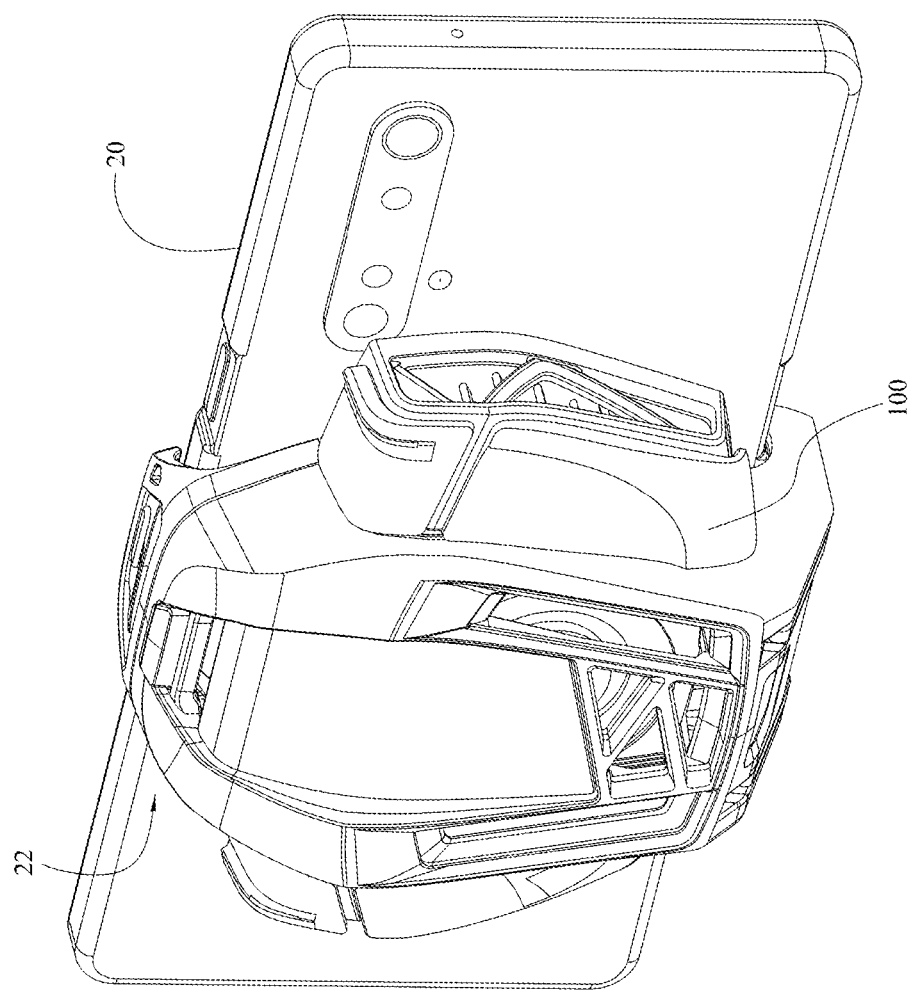
Figure 4:
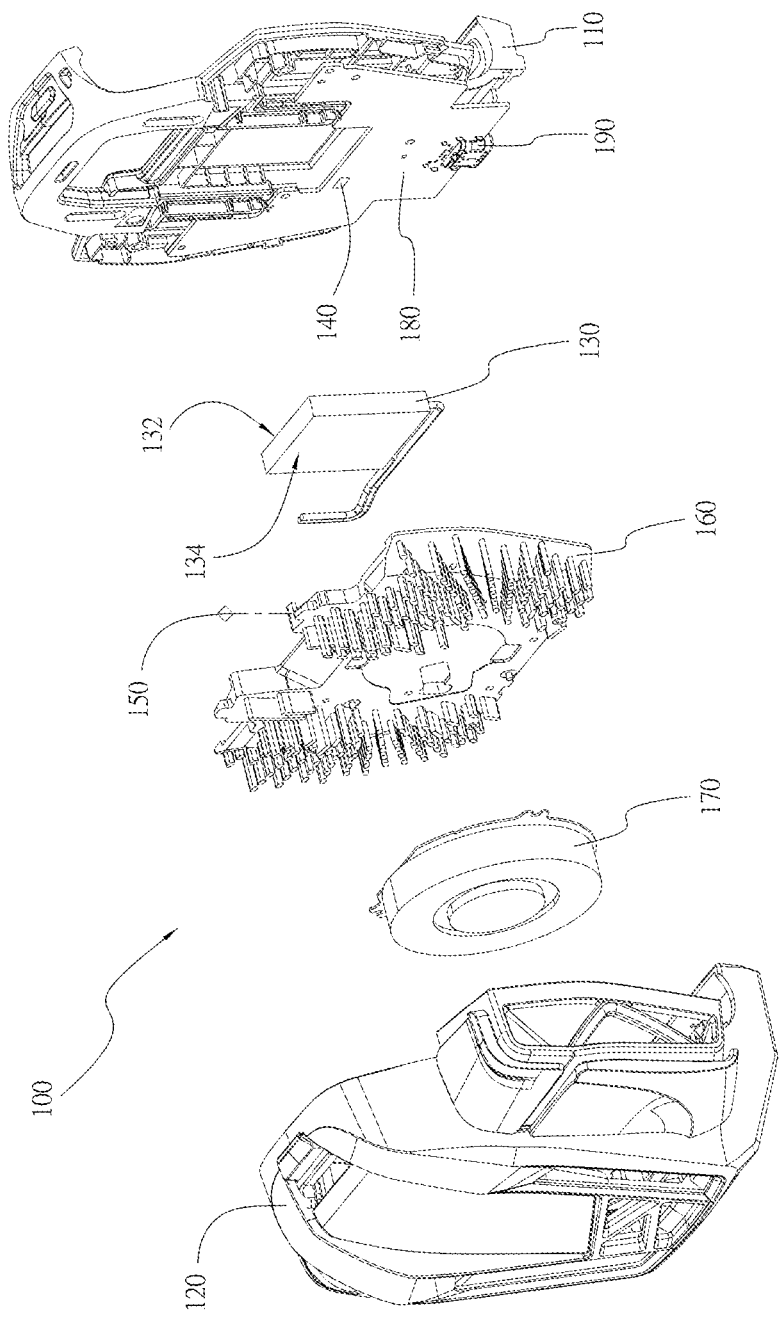
FIG. 4 is an exploded view of the thermal dissipation device in FIG. 1.
Figure 5:
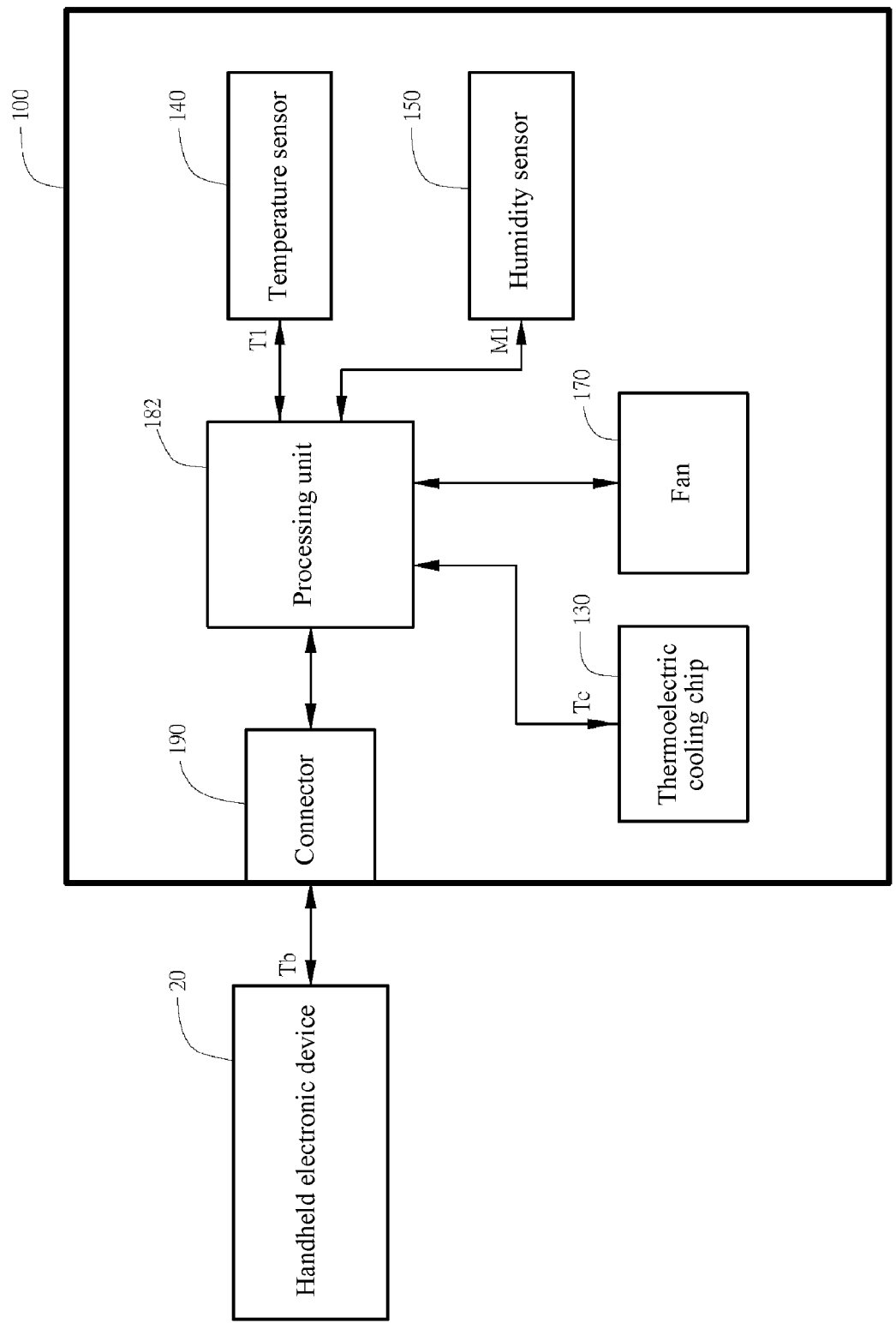
FIG. 5 is a block diagram of the thermal dissipation device in FIG. 1.

Referring to FIG. 3A, a thermal dissipation device 100 according to this disclosure is mounted on a handheld electronic device 20. The handheld electronic device 20 has a heating surface 22, and the heating surface 22 has a heating surface temperature Tb. In an embodiment, the handheld electronic device 20 is a smart phone, and the heating surface 22 is a back cover of the smart phone.

Referring to FIG. 1 to FIG. 5, the thermal dissipation device 100 includes a back plate 110, a casing 120, a thermoelectric cooling chip 130, a temperature sensor 140, a humidity sensor 150, cooling fins 160, a fan 170, and a circuit board 180.

The back plate 110 is configured to be attached to the heating surface 22 of the handheld electronic device 20. The casing 120 is connected to the back plate 110 to define an internal space. The thermoelectric cooling chip 130, the temperature sensor 140, the humidity sensor 150, the cooling fins 160, the fan 170, and the circuit board 180 are located in the internal space.

The thermoelectric cooling chip 130 has a cold surface 132 and a hot surface 134, where the cold surface 132 faces the back plate 110 and the hot surface 134 is located opposite to the cold surface 132. The cold surface 132 is attached to the heating surface 22 by means of a heat conduction structure 112, and has a cold surface temperature Tc. The heat conduction structure 112 is located on the back plate 110.

In an embodiment, the heat conduction structure 112 is a plate structure made of a material with high thermal conductivity, such as a copper metal plate, to improve heat conduction efficiency.

The temperature sensor 140 is disposed in an area adjacent to the thermoelectric cooling chip 130, to generate an environmental temperature Tl. As shown in the figures, the temperature sensor 140 is disposed on the back plate 110, close to the thermoelectric cooling chip 130. The humidity sensor 150 is disposed in an area adjacent to the thermoelectric cooling chip 130, to generate an environmental humidity Ml. In an embodiment, the humidity sensor 150 is disposed on the cooling fins 160.

The cooling fins 160 are disposed on the hot surface 134, to enlarge the thermal dissipation area and improve thermal dissipation efficiency. In an embodiment, the cooling fins 160 are attached to the hot surface 134 by using a thermally conductive adhesive. The fan 170 is disposed between the cooling fins 160 and the casing 120, and is configured to generate an air flow to take away the heat from the hot surface 134.

A processing unit 182 is disposed on the circuit board 180, and is electrically connected to the thermoelectric cooling chip 130, the temperature sensor 140, and the humidity sensor 150. The processing unit 182 is configured to calculate a dew point temperature Td based on the environmental temperature Tl and the environmental humidity Ml; and determine whether to stop the thermoelectric cooling chip 130 or not based on the cold surface temperature Tc, the dew point temperature Td, and the heating surface temperature Tb.

In an embodiment, the processing unit 182 is a microcontroller unit (MCU). In an embodiment, the processing unit 182 updates the dew point temperature Td, the cold surface temperature Tc, and the heating surface temperature Tb at a preset time interval, to determine whether to stop the thermoelectric cooling chip 130 or not.

The processing unit 182 is electrically connected to the handheld electronic device 20 to receive the heating surface temperature Tb corresponding to the heating surface 22. In an embodiment, the thermal dissipation device 100 has a connector 190, which is plugged into the handheld electronic device 20. The processing unit 182 is electrically connected to the handheld electronic device 20 by the connector 190 to receive the heating surface temperature Tb. The connector 190 is a universal serial port connector.

In other embodiments, the thermal dissipation device 100 is electrically connected to the handheld electronic device 20 wirelessly (such as via Bluetooth) to receive the heating surface temperature Tb. Moreover, in other embodiments, a heating surface temperature sensor (not shown in the figures) is disposed on the back plate 110 of the thermal dissipation device 100, to detect the heating surface temperature Tb directly.

In an embodiment, the processing unit 182 calculates a first heat value Hc corresponding to the thermoelectric cooling chip 130 based on the cold surface temperature Tc and the dew point temperature Td, and calculates a second heat value Hb corresponding to the heating surface 22 based on the heating surface temperature Tb and the dew point temperature Td.

In an embodiment, the processing unit 182 calculates the first heat value Hc corresponding to the thermoelectric cooling chip 130 according to formula (1) below, and calculates the second heat value Hb corresponding to the heating surface 22 according to formula (2) below.

$$Hc = ms(Tc - Td) \quad \text{Formula (1):}$$

$$Hb = ms(Tb - Td) \quad \text{Formula (2):}$$

In the formulas, m is mass of a system, and s is specific heat of the system. The system is a virtual heating system, corresponding to the handheld electronic device.

The first heat value Hc represents the heat energy that needs to be removed to lower the cold surface temperature Tc to the dew point temperature Td. The second heat value Hb represents the heat energy that needs to be removed to lower the heating surface temperature Tb of the heating surface 22 to the dew point temperature Td.

When the first heat value Hc is greater than or equal to the second heat value Hb, it indicates that there is still a significant temperature difference between the cold surface temperature Tc of the thermoelectric cooling chip 130 and the dew point temperature Td, and continuous operation of the thermoelectric cooling chip 130 will not cause the internal environment of the thermal dissipation device 100 to reach the dew point temperature. At this time, maintaining the operation of the thermoelectric cooling chip 130 does not cause condensation.

On the contrary, when the first heat value Hc is less than the second heat value Hb, it indicates that the temperature difference between the cold surface temperature Tc of the thermoelectric cooling chip 130 and the dew point temperature Td is limited, and continuous operation of the thermoelectric cooling chip 130 will easily cause the internal environment of the thermal dissipation device 100 to reach the dew point temperature. At this time, the operation of the thermoelectric cooling chip 130 is stopped to prevent the condensation.

When the first heat value Hc is less than the second heat value Hb, the processing unit 182 does not stop the operation of the fan 170, but maintains the operation of the fan 170 to generate air convection, so that the fan 170 blows more air to keep internal components of the thermal dissipation device 100 out of condensation conditions.

In an embodiment, when the first heat value Hc is less than the second heat value Hb, the processing unit 182 increases the rotation speed of the fan 170 to keep the internal components of the thermal dissipation device 100 out of the condensation conditions. Moreover, in other embodiments, when the first heat value Hc is less than the second heat value Hb, the processing unit 182 stops the fan 170 to reduce energy consumption.

In the foregoing embodiments, when the first heat value Hc is less than the second heat value Hb, the processing unit 182 stops the thermoelectric cooling chip 130 directly. In an embodiment, when the first heat value Hc is less than the second heat value Hb, the processing unit 182 further estimates the time required by the thermoelectric cooling chip 130 to remove the first heat value Hc and the time required by the handheld electronic device 20 to generate the second heat value Hb, to determine whether to stop the thermoelectric cooling chip 130 or not.

In an embodiment, assume that the thermoelectric cooling chip 130 has a heat dissipating wattage Wc, representing the heat that the thermoelectric cooling chip 130 removes per unit time, and the handheld electronic device 20 has a heating wattage Wb, representing the heat generated by the handheld electronic device 20 per unit time. The processing unit 182 calculates a first time tc corresponding to the thermoelectric cooling chip 130 according to formula (3) below, and calculates a second time tb corresponding to the heating surface 22 according to formula (4) below.

$$Hc/Wc=tc \quad \text{Formula (3):}$$

$$Hb/Wb=tb \quad \text{Formula (4):}$$

The first time tc represents the time required by the thermoelectric cooling chip 130 to remove the first heat value Hc, and the second time tb represents the time required by the handheld electronic device 20 to generate the second heat value Hb.

When the first heat value Hc is less than the second heat value Hb, but the first time tc is longer than or equal to the second time tb, it indicates that the handheld electronic device 20 generates heat faster than the thermoelectric cooling chip 130 dissipates heat. At this time, maintaining the operation of the thermoelectric cooling chip 130 does not cause condensation.

On the contrary, when the first heat value Hc is less than the second heat value Hb and the first time tc is shorter than the second time tb, it indicates that the continuous operation of the thermoelectric cooling chip 130 will cause the internal environment of the thermal dissipation device 100 to reach the dew point temperature soon. At this time, the thermoelectric cooling chip 130 is stopped to prevent the condensation.

In an embodiment, to further improve the heat dissipation effect, when the first heat value Hc is less than the second heat value Hb and the first time tc is shorter than the second time tb, the processing unit 182 does not stop the operation of the fan 170, but maintains the operation of the fan 170 to generate air convection, to keep the internal components of the thermal dissipation device 100 out of the condensation conditions.

In an embodiment, when the first heat value He is less than the second heat value Hb and the first time tc is shorter than the second time tb, the processing unit 182 increases the rotation speed of the fan 170 to keep the internal components of the thermal dissipation device 100 out of the condensation conditions. Moreover, in other embodiments, when the first heat value He is less than the second heat value Hb and the first time tc is shorter than the second time tc, the processing unit 182 stops the fan 170 to reduce energy consumption.

Figure 6:
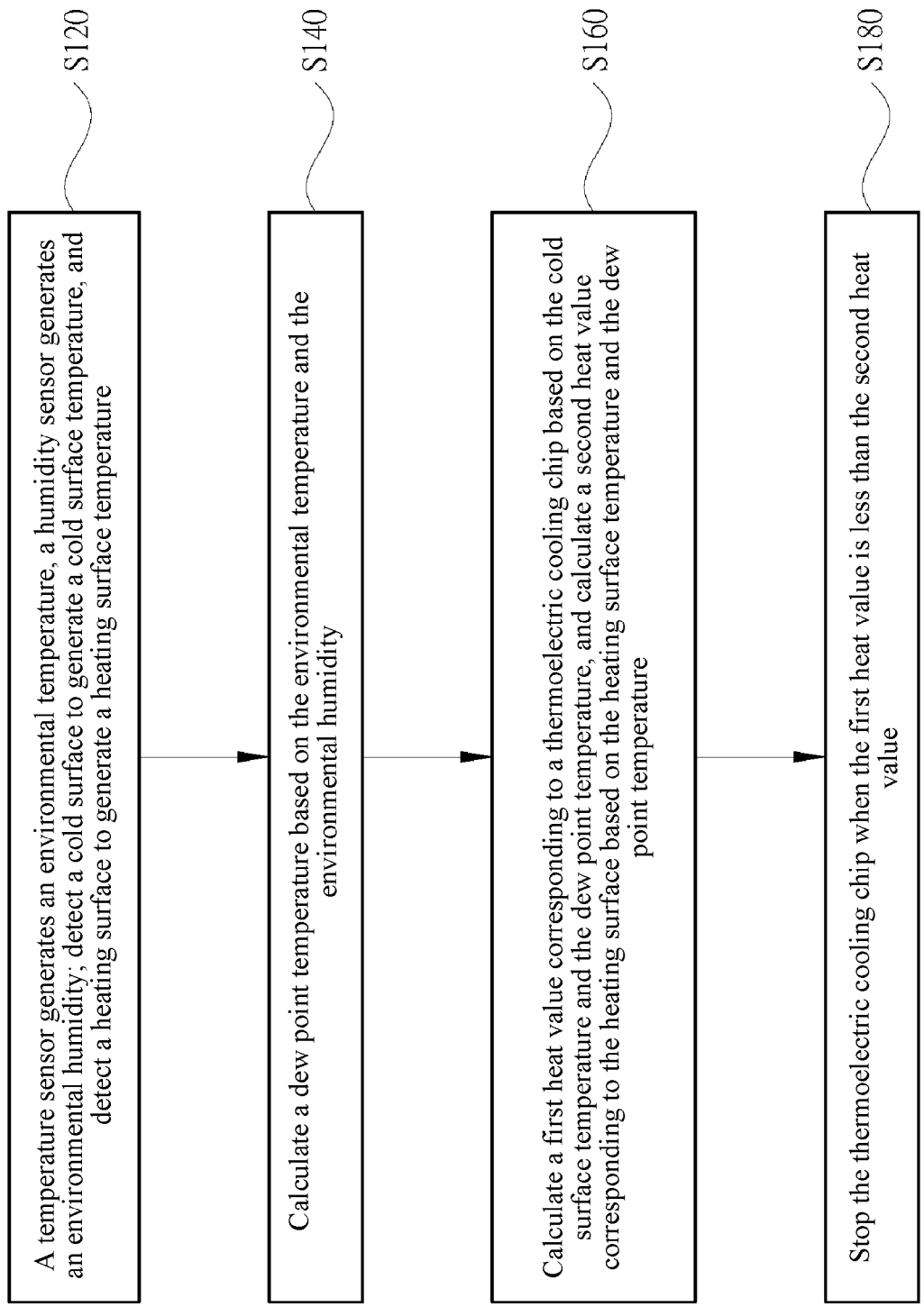
FIG. 6 is a flowchart of a control method according to an embodiment of this disclosure.

FIG. 6 is a flowchart of a control method according to an embodiment of this disclosure. The control method is applicable to the thermal dissipation device 100 shown in FIG. 1. The control method includes the following steps.

First, as described in step S120, the temperature sensor 140 generates the environmental temperature T1, and the humidity sensor 150 generates an environmental humidity M1. Detect the cold surface 132 to generate a cold surface temperature Tc and detect the heating surface 22 to generate a heating surface temperature Tb.

As described in step S140, calculate a dew point temperature Td based on the environmental temperature T1 and the environmental humidity M1.

Then, as described in step S160, calculate a first heat value He corresponding to the thermoelectric cooling chip 130 based on the cold surface temperature Tc and the dew point temperature Td, and calculate a second heat value Hb corresponding to the heating surface 22 based on the heating surface temperature Tb and the dew point temperature Td.

Then, as described in step S180, stop the thermoelectric cooling chip 130 when the first heat value He is less than the second heat value Hb.

Figure 7:
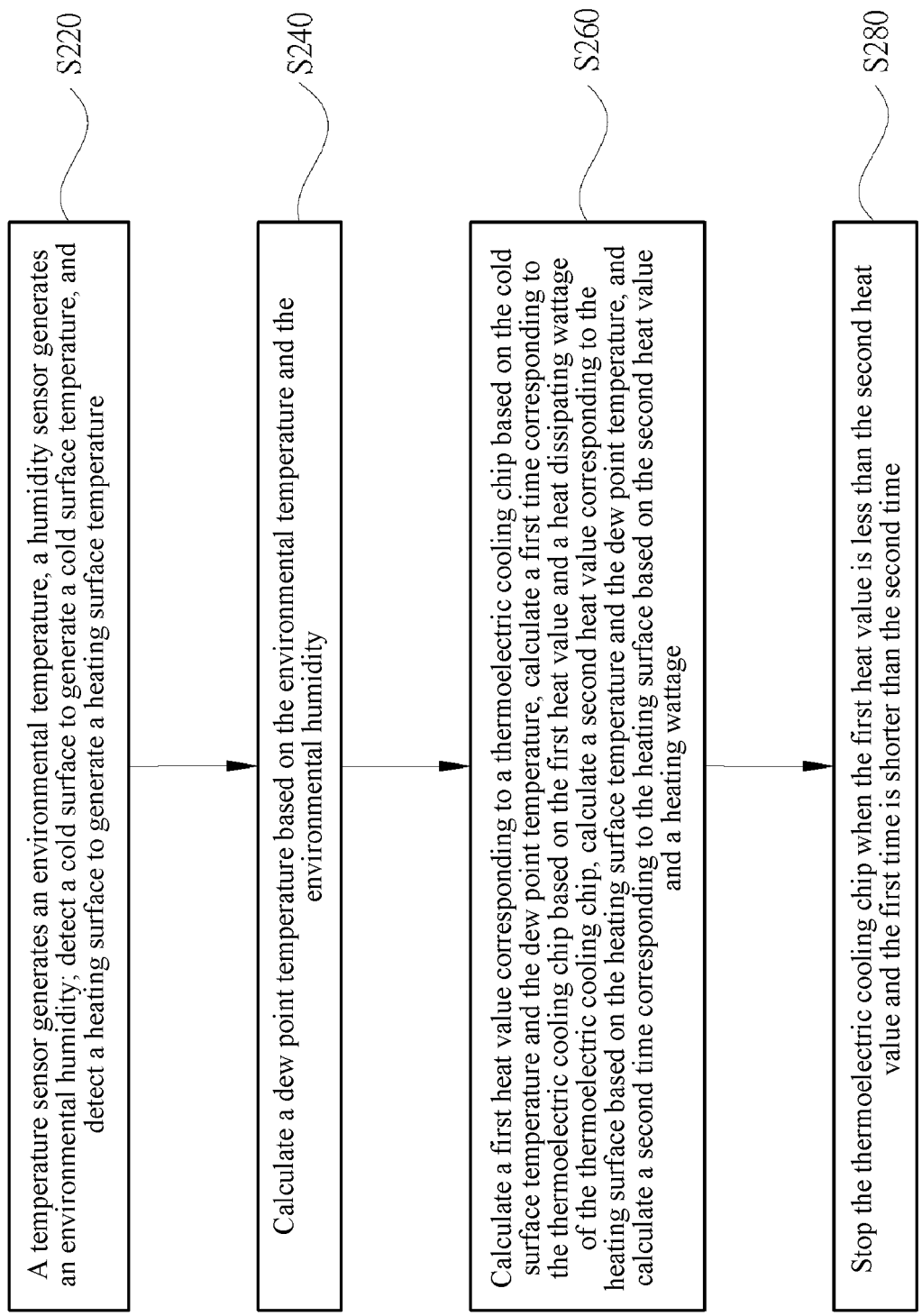
FIG. 7 is a flowchart of a control method according to another embodiment of this disclosure.

FIG. 7 is a flowchart of a control method according to another embodiment of this disclosure. The control method is applicable to the thermal dissipation device 100 shown in FIG. 1. The control method includes the following steps.

First, as described in step S220, the temperature sensor 140 generates an environmental temperature T1, and the humidity sensor 150 generates an environmental humidity M1. Detect the cold surface 132 to generate a cold surface temperature Tc and detect the heating surface 22 to generate a heating surface temperature Tb.

As described in step S240, calculate a dew point temperature Td based on the environmental temperature T1 and the environmental humidity M1.

Then, as described in step S260, calculate a first heat value Hc corresponding to the thermoelectric cooling chip 130 based on the cold surface temperature Tc and the dew point temperature Td, calculate a first time tc corresponding to the thermoelectric cooling chip 130 based on the first heat value Hc and a heat dissipating wattage of the thermoelectric cooling chip 130, calculate a second heat value Hb corresponding to the heating surface 22 based on the heating surface temperature Tb and the dew point temperature Td, and calculate a second time tb corresponding to the heating surface 22 based on the second heat value Hb and a heating wattage.

Then, as described in step S280, stop the thermoelectric cooling chip 130 when the first heat value Hc is less than the second heat value Hb and the first time tc is shorter than the second time tb.

The thermal dissipation device 100 and the control method thereof provided by this disclosure detect the environmental temperature and the environmental humidity inside the thermal dissipation device, to calculate the dew point temperature corresponding to the environment inside of the thermal dissipation device, calculate the first heat value Hc corresponding to the thermoelectric cooling chip 130 based on the cold surface temperature Tc and the dew point temperature Td of the thermoelectric cooling chip 130, calculate the second heat value Hb corresponding to the heating surface 22 based on the heating surface temperature Tb of the heating surface 22 and the dew point Td, and then determine whether to stop the thermoelectric cooling chip or not based on the first heat value Hc and the second heat value Hb. In this way, condensation caused by the continuous operation of the thermoelectric cooling chip is prevented, and a balance is achieved between thermal dissipation operation and prevention of condensation.

The thermal dissipation device 100 and the control method thereof provided by this disclosure not only calculate the first heat value Hc corresponding to the thermoelectric cooling chip 130 and the second heat value Hb corresponding to the heating surface 22, but also calculate the first time tc corresponding to the thermoelectric cooling chip 130 and the second time tb corresponding to the heating surface 22, and take the first time tc and the second time tb into consideration to determine whether to stop the thermoelectric cooling chip or not. In this way, the thermal dissipation efficiency of the thermal dissipation device 100 is further improved.

The above are only preferred embodiments of this disclosure, and do not limit this disclosure in any way. Any person skilled in the art makes equivalent replacements or modifications in any form to the technical means and technical content disclosed in this disclosure without departing from the scope of the technical means of this disclosure. These equivalent replacements or modifications are within the content of the technical means of this disclosure, and still fall within the protection scope of this disclosure.

What is claimed is:

1. A thermal dissipation device, for a handheld electronic device, wherein the handheld electronic device has a heating surface, and the heating surface has a heating surface temperature, the thermal dissipation device comprising:
    a thermoelectric cooling chip, having a cold surface and a hot surface, wherein the cold surface is attached on the heating surface by means of a heat conduction structure, and has a cold surface temperature;
    a temperature sensor, disposed in an area adjacent to the thermoelectric cooling chip, and configured to generate an environmental temperature;
    a humidity sensor, disposed in the adjacent area, and configured to generate an environmental humidity; and
    a processing unit, electrically connected to the thermoelectric cooling chip, the temperature sensor, and the humidity sensor, and configured to:
    calculate a dew point temperature based on the environmental temperature and the environmental humidity; and
    determine whether to stop the thermoelectric cooling chip or not based on the cold surface temperature, the dew point temperature, and the heating surface temperature,
    wherein the processing unit is configured to calculate a first heat value corresponding to the thermoelectric cooling chip based on the cold surface temperature and the dew point temperature, and a second heat value corresponding to the heating surface based on the heating surface temperature and the dew point temperature, and to stop the thermoelectric cooling chip when the first heat value is less than the second heat value.

2. The thermal dissipation device according to claim 1, further comprising a fan, configured to generate an air flow to take away heat from the hot surface.

3. The thermal dissipation device according to claim 2, wherein the processing unit stops the fan when the first heat value is less than the second heat value.

4. The thermal dissipation device according to claim 1, wherein the thermoelectric cooling chip has a heat dissipating wattage and the handheld electronic device has a heating wattage, the processing unit is configured to calculate a first heat value corresponding to the thermoelectric cooling chip based on the cold surface temperature and the dew point temperature, a first time corresponding to the thermoelectric cooling chip based on the first heat value and the heat dissipating wattage, a second heat value corresponding to the heating surface based on the heating surface temperature and the dew point temperature, and a second time corresponding to the heating surface based on the second heat value and the heating wattage, and to stop the thermoelectric cooling chip when the first heat value is less than the second heat value and the first time is shorter than the second time.

5. The thermal dissipation device according to claim 4, further comprising a fan, configured to generate an air flow to take away heat from the hot surface.

6. The thermal dissipation device according to claim 5, wherein the processing unit stops the fan when the first heat value is less than the second heat value and the first time is shorter than the second time.

7. The thermal dissipation device according to claim 1, wherein the heating surface is a back cover of the handheld electronic device.

8. The thermal dissipation device according to claim 1, wherein the heat conduction structure comprises a copper metal plate.

9. The thermal dissipation device according to claim 1, wherein the processing unit updates the dew point temperature, the cold surface temperature, and the heating surface temperature at a preset time interval, to determine whether to stop the thermoelectric cooling chip or not.

10. The thermal dissipation device according to claim 1, wherein the processing unit is electrically connected to the handheld electronic device to receive the heating surface temperature corresponding to the heating surface.

11. A control method for a thermal dissipation device, wherein the thermal dissipation device is mounted on a handheld electronic device, the handheld electronic device has a heating surface and a heating wattage, the thermal dissipation device comprises a thermoelectric cooling chip, a temperature sensor and a humidity sensor, the thermoelectric cooling chip has a cold surface and a hot surface, the cold surface is attached on the heating surface by means of a heat conduction structure and has a cold surface temperature, the temperature sensor is disposed in an area adjacent to the thermoelectric cooling chip, and the humidity sensor is disposed in the adjacent area, wherein the control method comprises:
    generating, by the temperature sensor, an environmental temperature, generating, by the humidity sensor, an environmental humidity, detecting the cold surface to generate the cold surface temperature, and detecting the heating surface to generate a heating surface temperature;
    calculating a dew point temperature based on the environmental temperature and the environmental humidity; and
    determining whether to stop the thermoelectric cooling chip or not based on the cold surface temperature, the dew point temperature, and the heating surface temperature,
    wherein the step of determining whether to stop the thermoelectric cooling chip or not based on the cold surface temperature, the dew point temperature, and the heating surface temperature comprises:
        calculating a first heat value corresponding to the thermoelectric cooling chip based on the cold surface temperature and the dew point temperature;
        calculating a second heat value corresponding to the heating surface based on the heating surface temperature and the dew point temperature; and
        stopping the thermoelectric cooling chip when the first heat value is less than the second heat value.

12. The control method according to claim 11, wherein the thermal dissipation device further comprises a fan configured to generate an air flow to take away heat from the hot surface, and the control method further comprises: stopping the fan when the first heat value is less than the second heat value.

13. The control method according to claim 11, wherein the thermoelectric cooling chip has a heat dissipating wattage and the handheld electronic device has a heating wattage, and the step of determining whether to stop the thermoelectric cooling chip or not based on the cold surface temperature, the dew point temperature, and the heating surface temperature comprises:
 calculating a first heat value corresponding to the thermoelectric cooling chip based on the cold surface temperature and the dew point temperature;
 calculating a first time corresponding to the thermoelectric cooling chip based on the first heat value and the heat dissipating wattage;
 calculating a second heat value corresponding to the heating surface based on the heating surface temperature and the dew point temperature;
 calculating a second time corresponding to the heating surface based on the second heat value and the heating wattage; and
 stopping the thermoelectric cooling chip when the first heat value is less than the second heat value and the first time is shorter than the second time.

14. The control method according to claim 13, wherein the thermal dissipation device further comprises a fan configured to generate an air flow to take away heat from the hot surface, and the control method further comprises: stopping the fan when the first heat value is less than the second heat value and the first time is shorter than the second time.

* * * * *